(12) United States Patent
Pogge et al.

(10) Patent No.: US 6,835,589 B2
(45) Date of Patent: Dec. 28, 2004

(54) THREE-DIMENSIONAL INTEGRATED CMOS-MEMS DEVICE AND PROCESS FOR MAKING THE SAME

(75) Inventors: H. Bernhard Pogge, Wappingers Falls, NY (US); Michel Despont, Adliswil (CH); Ute Drechsler, Kilchberg (CH); Chandrika Prasad, Wappingers Falls, NY (US); Peter Vettiger, Langnau am Albis (CH); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/294,140

(22) Filed: Nov. 14, 2002

(65) Prior Publication Data

US 2004/0097002 A1 May 20, 2004

(51) Int. Cl.[7] .............................................. H01L 21/00
(52) U.S. Cl. ........................... 438/52; 438/109; 438/50; 438/51; 438/14; 438/461; 257/254; 216/52
(58) Field of Search ................... 438/109, 14, 460–462, 438/50–52, 15–17; 257/254; 216/2, 52

(56) References Cited

U.S. PATENT DOCUMENTS

| | | | | |
|---|---|---|---|---|
| 5,475,318 A | * | 12/1995 | Marcus et al. ............... 324/762 |
| 6,250,933 B1 | * | 6/2001 | Khoury et al. ................. 439/66 |
| 6,291,140 B1 | * | 9/2001 | Andreoli et al. ............. 430/322 |
| 6,473,361 B1 | * | 10/2002 | Chen et al. ................... 365/244 |
| 6,475,822 B2 | * | 11/2002 | Eldridge et al. ............... 438/52 |
| 6,583,411 B1 | * | 6/2003 | Altmann et al. ............. 250/306 |
| 6,586,133 B1 | * | 7/2003 | Teeters et al. ............... 429/152 |
| 6,645,145 B1 | * | 11/2003 | Dreschel et al. ............. 600/443 |
| 6,651,325 B2 | * | 11/2003 | Lee et al. ....................... 29/846 |
| 2002/0096967 A1 | * | 7/2002 | Ma et al. ...................... 310/309 |
| 2003/0038703 A1 | * | 2/2003 | Weaver et al. ............... 337/335 |
| 2003/0076649 A1 | * | 4/2003 | Speakman .................. 361/524 |
| 2003/0081651 A1 | * | 5/2003 | Gianchandani et al. ..... 374/185 |
| 2003/0119221 A1 | * | 6/2003 | Cunningham et al. ......... 438/52 |
| 2003/0137389 A1 | * | 7/2003 | Weaver et al. ................ 337/36 |

OTHER PUBLICATIONS

"3–D Integration using wafer bonding," J–Q Lu et al.—Article—pp. 1–7.
"Ultrathin GaAs space solar cell devices," Hardingham et al.,1996 IEEE, 25th PVSC; May 13–17, 1996, Washington, DC.

(List continued on next page.)

Primary Examiner—Matthew Smith
Assistant Examiner—Granvill D. Lee
(74) Attorney, Agent, or Firm—Jay H. Anderson

(57) ABSTRACT

A vertically integrated structure includes a microelectromechanical system (MEMS) and a chip for delivering signals to the MEMS. The MEMS has an anchor portion having a conductor therethrough, by which it is connected to a substrate. The chip is attached to the MEMS substrate in a direction normal to the substrate surface, so as to make a conductive path from the chip to the MEMS. The chip may be attached by bonding the conductor to C4 metal pads formed on the chip, or by bonding the conductor to metal studs on the chip. The MEMS substrate may be thinned before attachment to the chip, or may be removed from the underside of the MEMS. A temporary carrier plate is used to facilitate handling of the MEMS and alignment to the chip.

23 Claims, 18 Drawing Sheets

OTHER PUBLICATIONS

"Residual thermomechanical stresses in thinned–chip assemblies," Leseduarte et al., IEEE Transactions on components and packaging technologies, vol. 23, No. 4, Dec. 2000.

"High bandwith interconnects via a novel chip–stack package," Eric Beyne, IMEC, Leuven, Belgium, Solid State Technology, Apr. 2002 pp. S19–S22.

"The "Millipede"—more than one thousand tips for future AFM data storage," Vettiger et al., IBM Journal of Research and Development, vol. 44, No. 3, May 2000, pp. 323–338.

"VLSI–NEMS chip for parallel AFM data storage," Despont et al., Reprinted from Sensors and Actuators 80 (2000) 100–107.

"Automated handling of ultra–thin silicon wafers" F. A. Tony Schraub, Solid State Technology, Sep. 2002, pps. 59–64.

"Saving energy and natural resource by micro–nanomachining" Masayoshi Esashi, Technical Digest: 15th IEEE Conference on Micro–Electro Mechanical System, Las Vegas, NV, Jan. 20–24, 2002, pps. 220–227.

* cited by examiner

THREE-DIMENSIONAL INTEGRATED CMOS-MEMS DEVICE AND PROCESS FOR MAKING THE SAME

FIELD OF THE INVENTION

This invention relates to the manufacture of very large-scale integrated devices including CMOS logic devices and micro-electromechanical (MEMS) devices for the next generation of data storage. In particular, the invention relates to fabrication of three-dimensional device structures including CMOS and MEMS chips.

BACKGROUND OF THE INVENTION

The use of micro-electromechanical systems (MEMS) and nano-electromechanical systems (NEMS) for ultrahigh density data storage has recently been reported. This approach to data storage utilizes a thermomechanical local probe technique with large arrays of nanometer-scale tips, such as are now used in atomic-force microscope and scanning-tunneling microscope technology. In this technique, a read/write operation is performed by heating a cantilever mechanism, causing a tip to contact a thin film storage medium and either create or detect depressions made therein.

Some details of the design of MEMS structures for data storage have been recently published in IBM J. Res. Develop. 44, 323 (2000) and in Sensors and Actuators 80, 100 (2000).

An individual cantilever cell is shown schematically in FIG. 1A (cross-section view) and FIG. 1B (plan view). The MEMS chip 1, typically of silicon, is processed to yield a silicon cantilever 10 with a tip 11 and a heater 13. As shown in FIG. 1A, the cantilever structure 10 is formed on a layer at the surface of chip 1, and a cavity is then etched in the bulk silicon behind cantilever 10. Applying electrical power via the through connection 15 causes a temperature increase in the heater and tip, which is in contact with storage medium 12 (typically a thin polymer film on a silicon substrate). The combination of tip pressure on the storage medium and the tip heating causes the tip to create an indentation in the storage medium, thereby realizing thermomechanical data writing with very high bit a real densities.

A conventional 2-dimensional arrangement for controlling the MEMS chip 1 is shown schematically in FIG. 2. The MEMS chip 1, which includes a large number of individual cells, is electrically controlled by multiplex drivers 2 having conventional wirebonding connections to the edge of chip 1. There are limitations inherent in the 2-dimensional arrangement of electrical connections. For example, as the number of cells in chip 1 increases, it becomes more difficult to provide electrical isolation between cells; at the same time, higher power is required to address the cell array while the size of individual connections decreases.

Accordingly, there is a need for a 3-dimensional integration scheme in which MEMS devices and their control devices (such as CMOS logic chips) may be interconnected, in order to overcome the electrical limitations of the conventional 2-dimensional configuration.

SUMMARY OF THE INVENTION

The present invention addresses the above-described need by providing a method for integrating a chip having a micromechanical device and a chip having an electronic device. In particular, the invention provides a method for vertical integration of a chip and a MEMS where the MEMS may make contact with a surface (such as the surface of a film serving as a storage device) and have mechanical motion with respect to that surface in the vertical direction.

According to one aspect of the invention, a method is provided for fabricating an integrated structure including a micro-electromechanical system (MEMS) and a chip for delivering signals to the MEMS. The MEMS is formed on a substrate, and has an anchor portion by which it is connected to the substrate (In one embodiment of the invention, the MEMS is a cantilever which overhangs a cavity in the substrate, and is anchored to the substrate at the anchor portion.) A conductor is formed which extends from the anchor portion of the MEMS through the MEMS substrate. The chip is attached to the MEMS substrate in a direction normal to the substrate surface, so as to make a conductive path from the chip to the MEMS. The chip may be attached by (1) forming a C4 metal pad on the chip, aligning the C4 metal pad to the conductor, and then bonding the C4 metal to the conductor; or (2) forming a metal stud on the chip, aligning the stud to the conductor; and bonding the stud to the conductor. It is preferable that the MEMS substrate be thinned before the chip is attached; this may conveniently be done by first attaching a carrier plate, and then removing the carrier plate after the attaching process is complete.

According to another aspect of the invention, a method is provided for fabricating an integrated structure including a micro-electromechanical system (MEMS) and a chip for delivering signals to the MEMS. In this method, the MEMS is formed on the substrate and has an anchor portion with an opening therein, and a conductor is formed in the opening of the anchor portion. The MEMS substrate is then removed, thereby exposing an underside of the MEMS and the conductor. The chip is then attached to the anchor portion of the MEMS in a direction normal to the substrate surface, so as to make a conductive path from the chip to the MEMS. Before the substrate is removed, it is convenient to deposit a layer overlying the MEMS, and to attach a carrier plate thereto; the carrier plate is removed after the MEMS and the chip are attached. The connection between the chip and the MEMS is through a metal stud formed on the chip, in an opening in a layer overlying the chip. The underside of the MEMS is thus spaced from the chip by a distance corresponding to the thickness of that layer.

According to an additional aspect of the invention, a vertically integrated structure is provided in which a micro-electromechanical system (MEMS) and a chip for delivering signals to the MEMS are connected. The structure includes a layer overlying a portion of the chip and having an opening therein; a metal stud in the opening and contacting the chip; and the MEMS having an anchor portion and an end portion extending horizontally therefrom. The anchor portion is attached to the layer and includes a conductor in contact with the metal stud. The MEMS is spaced from the chip by a distance corresponding to a thickness of the layer; the MEMS may then contact another layer spaced from the chip in a vertical direction.

DETAILED DESCRIPTION OF PREFERRED EMBODIMENTS

Figure 1A:
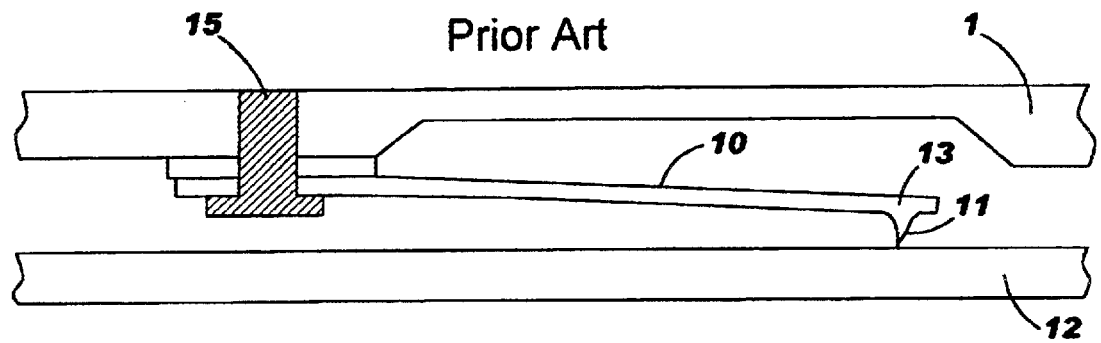
FIG. 1A is a schematic cross-sectional view of a cell of a MEMS chip used for data storage.
Figure 1B:
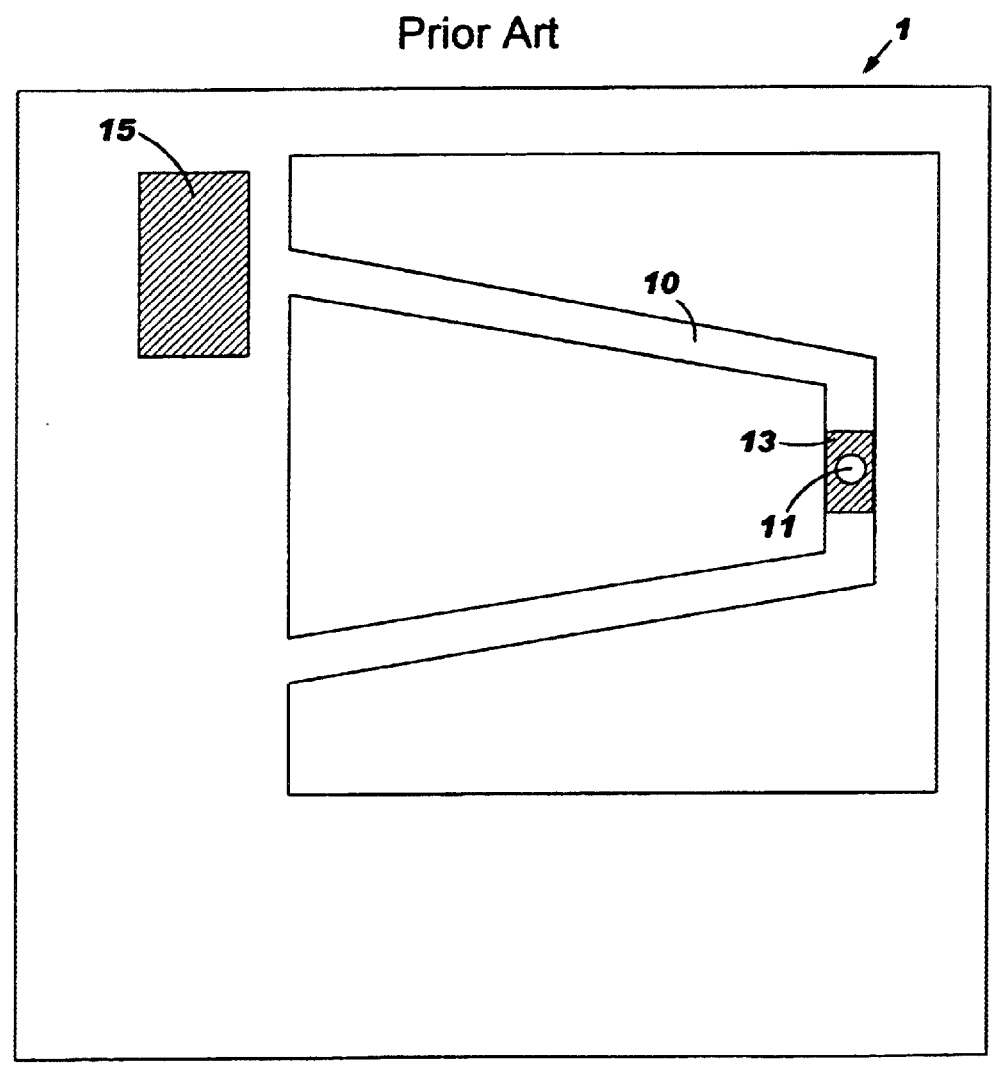
FIG. 1B is a plan view of the cell of FIG. 1A.
Figure 2:
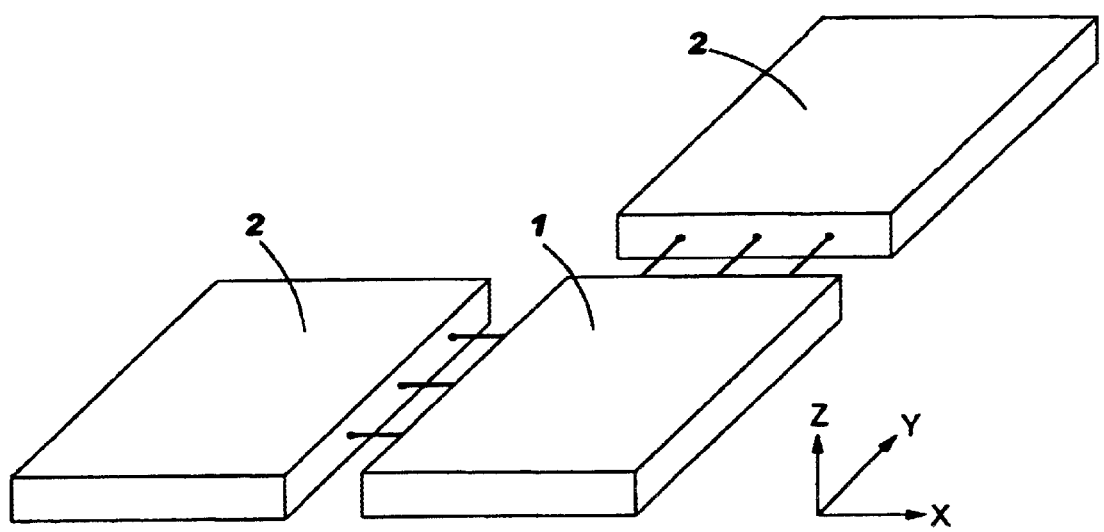
FIG. 2 is a schematic view of a conventional 2-dimensional arrangement for connecting a MEMS chip to driver chips.
Figure 3:
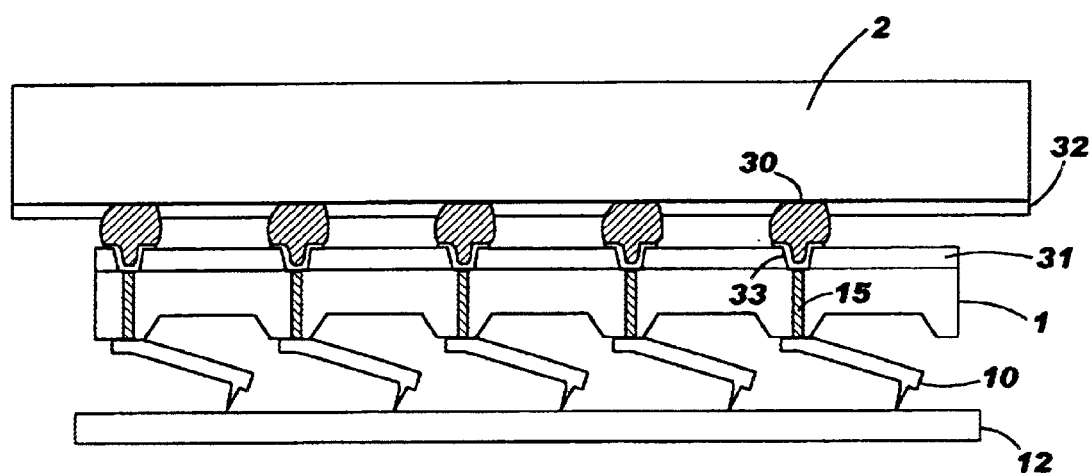
FIG. 3 is a cross-sectional view of a completed 3-dimensional integrated MEMS/CMOS device where the connection between MEMS and CMOS chips is realized using C4 technology.

FIG. 3 illustrates an embodiment of the invention wherein a memory storage device includes 3-dimensional integration of a MEMS chip 1 and a CMOS chip 2, and where the connections between the chips are made using C4 technology. The MEMS chip has an array of cantilevers 10 aligned to an array of C4 solder bumps 30 on the CMOS chip. The cantilevers 10 on the MEMS chip make contact with the storage medium 12. Movement of the cantilevers is controlled by the CMOS chip; connection between an individual cantilever and the CMOS chip is through an electrical pathway which includes interconnect 15 through the MEMS chip, pad 33 formed on a polyimide layer 31 on the backside of the MEMS chip, and the C4 solder bump 30. (The solder bump is connected to a pad, not shown, formed on a polyimide layer 32 on the CMOS chip 2.)

Figure 4:
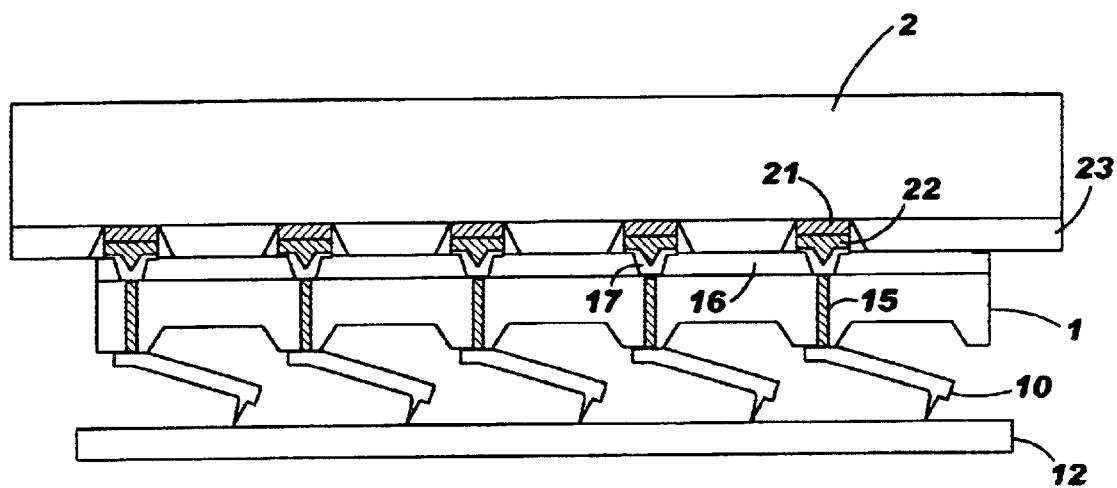
FIG. 4 is a cross-sectional view of a completed 3-dimensional integrated MEMS/CMOS device where the connection between MEMS and CMOS chips is realized using vertical stud/via connections.

FIG. 4 illustrates another embodiment of the invention, wherein a memory storage device is fabricated by integrating a MEMS chip 1 and a CMOS chip 2 using vertical stud/via connections. The MEMS chip has an interconnect 15 through the chip and a coating 16 of polyimide on the backside of the chip; electrical contact to the MEMS chip is through pads 17 formed in openings in the polyimide coating. The CMOS chip 2 also has a polyimide coating 23 on the backside thereof, with openings to match the locations of pads 17. The CMOS chip has studs 21 in those openings, with solder 22 providing a conductive connection between the pads 17 and the studs. The polyimide layers 16, 23 on the MEMS chip and CMOS chip are in mechanical contact, so that the chips are both physically and electrically integrated.

Details of the processes for 3-dimensional integration of MEMS and CMOS chips are given below. It will be appreciated that the MEMS cantilever structure is an example only, and that the invention is applicable to a variety of micro-electromechanical devices.

Preparation of MEMS Chip

Figure 5A:
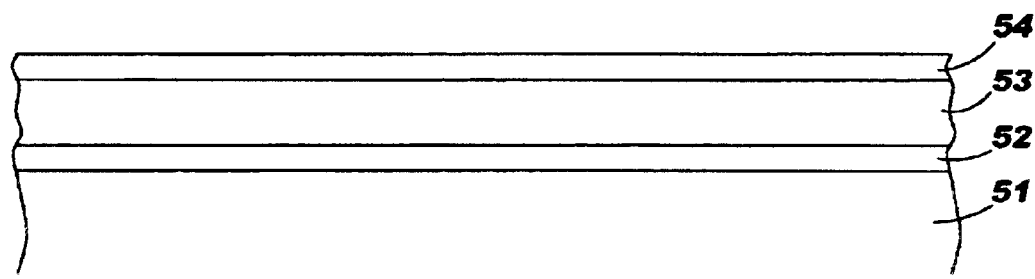
FIGS. 5A–5F illustrate steps in the fabrication of a MEMS chip having through-wafer connections, in accordance with an embodiment of the invention.
Figure 5B:
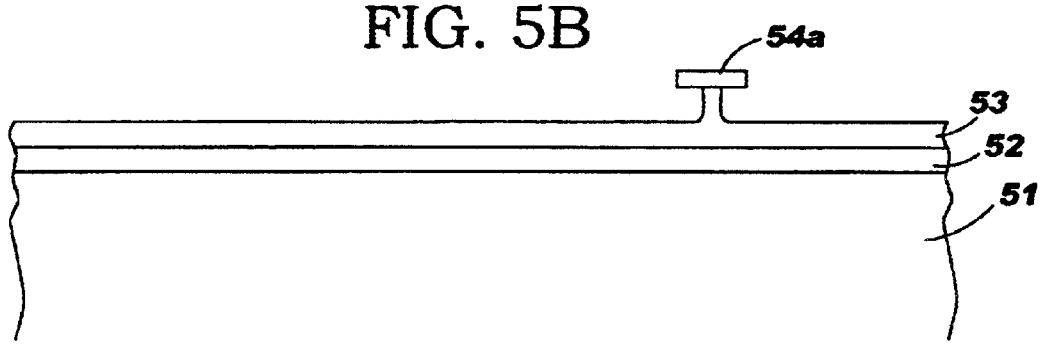
Figure 5C:
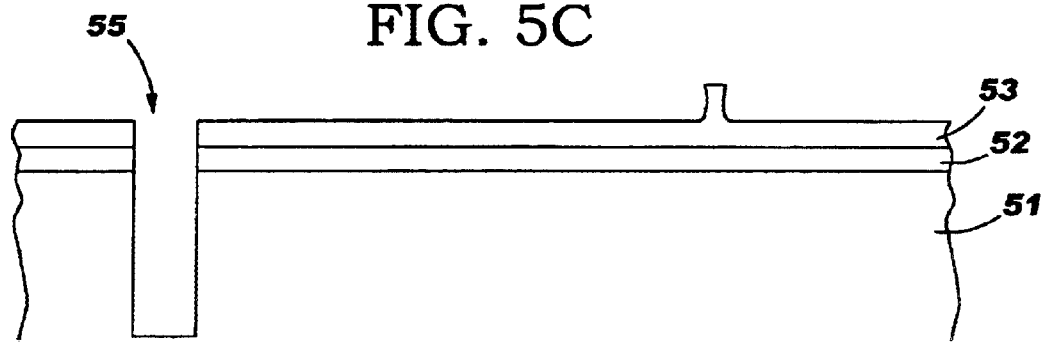

In accordance with an embodiment of the present invention, a MEMS chip having an array of silicon cantilevers is prepared as shown in FIGS. 5A–5F. FIG. 5A shows a silicon-on-insulator (SOI) wafer having a buried oxide (BOX) layer 52 on bulk silicon 51, silicon layer 53 overlying the BOX, and a thermal oxide layer 54. Typical thicknesses of layers 52–54 are 400 nm, 4 $\mu$m and 500 nm respectively. Oxide layer 54 is then masked and etched so that only a portion 54a remains, which in turn serves as a mask for etching of silicon layer 53 (see FIG. 5B). The masked portion of the silicon layer is processed later to form the nanometer-scale tip. A deep via opening 55 is then etched into the substrate 51; the dimensions of this via are in accordance with available lithography and the design of the MEMS cell (FIG. 5C).

Figure 5D:
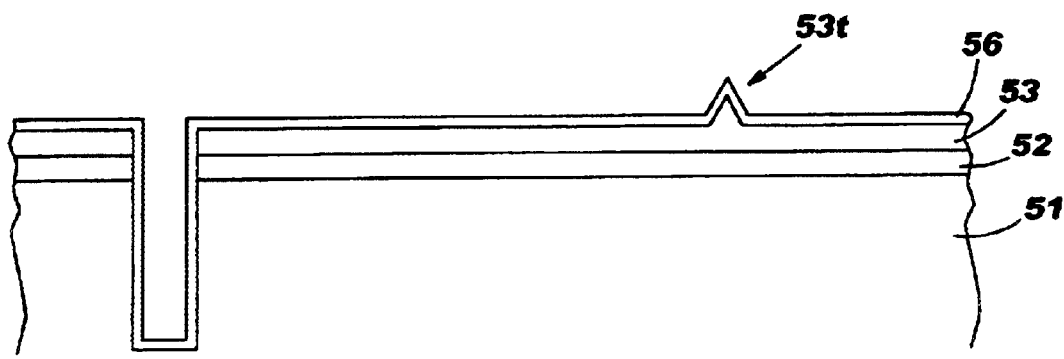
Figure 5E:
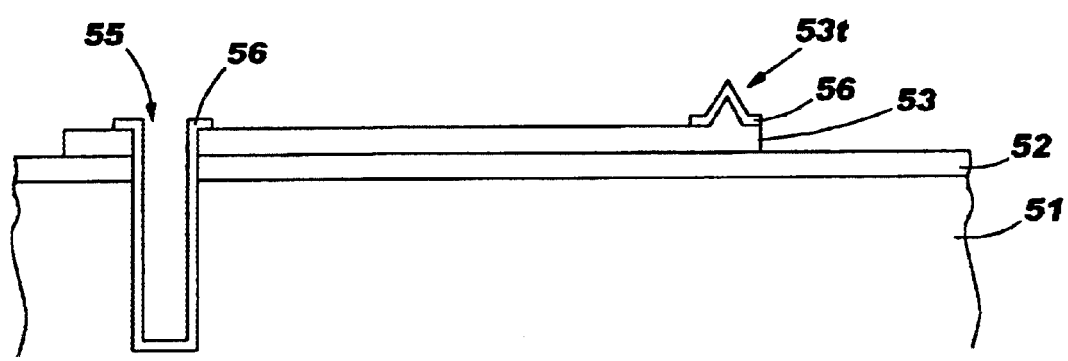

A thermal oxide layer 56 is then grown on silicon layer 53 and on the side wall of opening 55. The small unetched portion of layer 53 is partially consumed in the oxidation process, which has the effect of sharpening the silicon to a tip 53t (FIG. 5D). Layers 53 and 56 are then etched to form the cantilever structure including the heater, with the tip 53t still protected by oxide (FIG. 5E).

The etched via opening 55 is then filled with metal 57 which will form the through-connection. A contact pad 58 is then deposited over the top of the via and on the adjacent silicon, at the end of the cantilever opposite the tip. Another oxide layer 59 (preferably low-temperature oxide) is deposited as a blanket layer, and an opening 60 is then etched down to the surface of substrate 51 (see FIG. 5F).

At this point the MEMS structure is ready to have the cavity etched in the substrate (thereby releasing the cantilever tip end from the substrate), and to be thinned in preparation for joining to the CMOS device. These steps may be performed in two different ways, as shown in FIGS. 6A–6C and 7A–7C respectively.

Figure 5F:
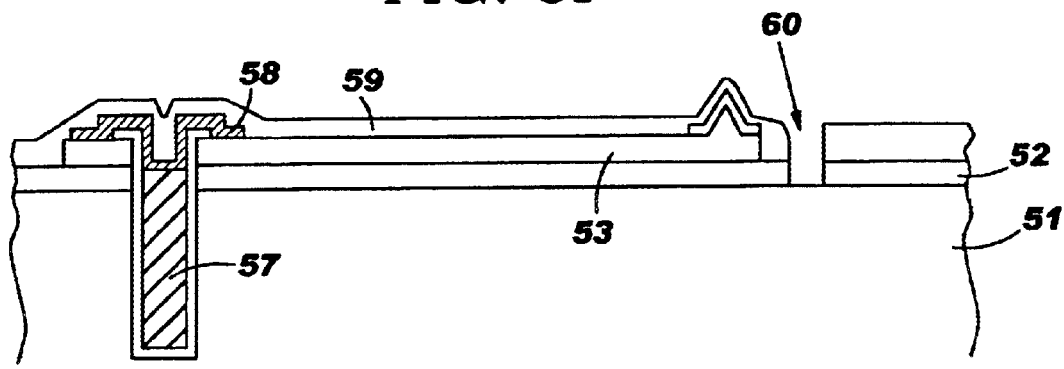
Figure 6A:
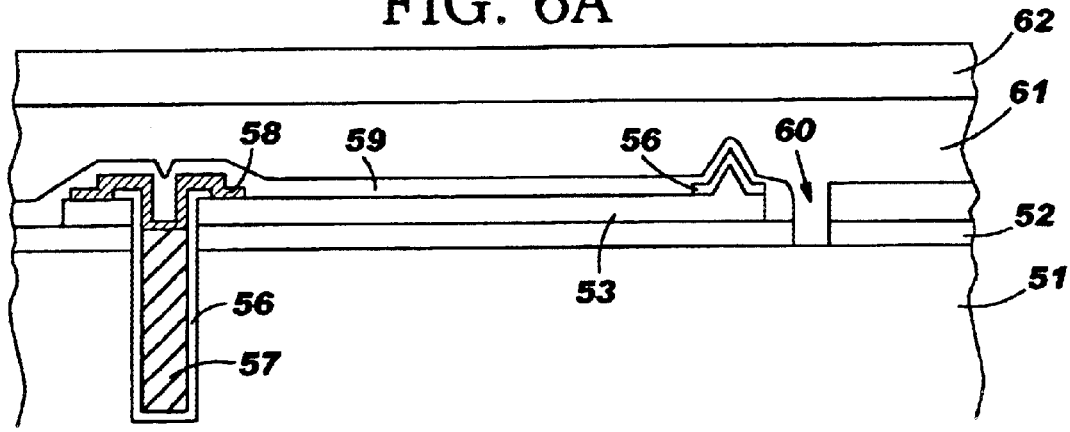
FIGS. 6A–6C illustrate further steps in the fabrication of a MEMS chip, following the steps shown in FIGS. 5A–5F.
Figure 6B:
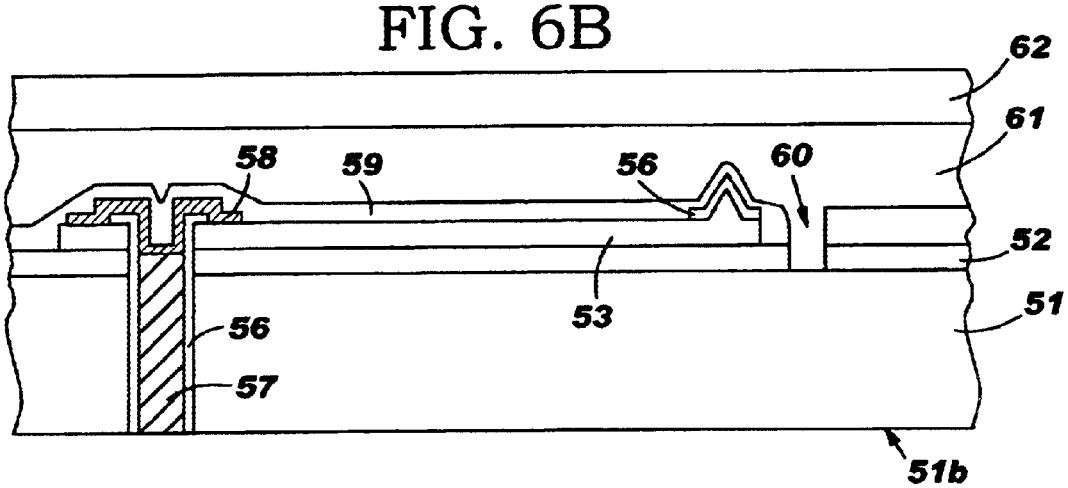
Figure 6C:
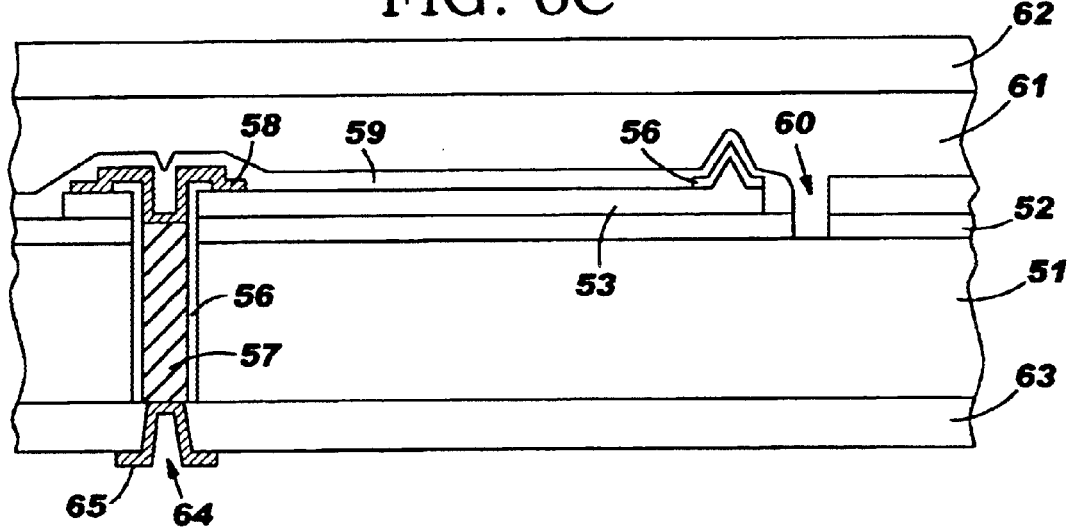

(1) FIG. 6A shows the structure of FIG. 5F first covered by a polyimide layer 61 and then having a carrier plate 62 bonded to the polyimide. The carrier plate is used to facilitate handling of the MEMS substrate after the substrate is thinned. It is preferable that the carrier be transparent to ablating radiation (e.g. a glass wafer) so that it can be conveniently removed afterwards. The MEMS substrate is then thinned in a grinding or polishing operation, so that the electrical through-connection is exposed on the backside surface 51b of the substrate (FIG. 6B). A polyimide layer 63 is then deposited on the backside of the substrate, and has openings 64 formed therein to expose the metallization 57. Metal pads 65 are then formed in the openings to contact metal 57 and complete the through-connection (FIG. 6C). The cavity etch is performed through opening 60 after the carrier 62 and polyimide layer 61 are removed. This structure is suitable for integration with a CMOS chip using stud/via connections, as described in more detail below.

Figure 7A:
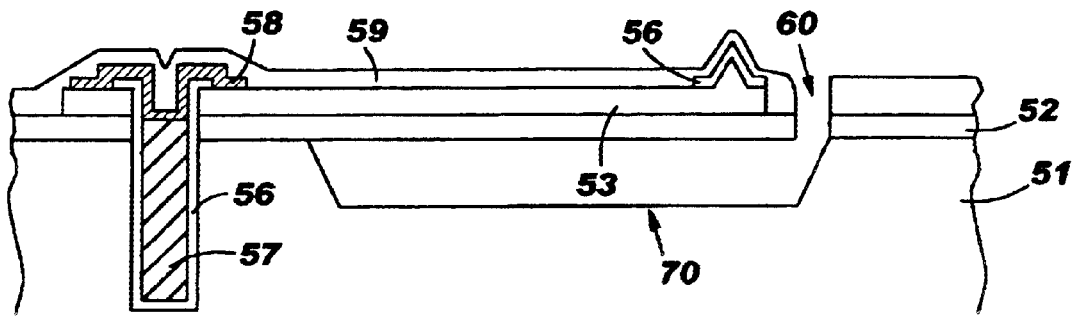
FIGS. 7A–7C illustrate an alternative to the process of FIGS. 6A–6C in fabricating a MEMS chip.
Figure 7B:
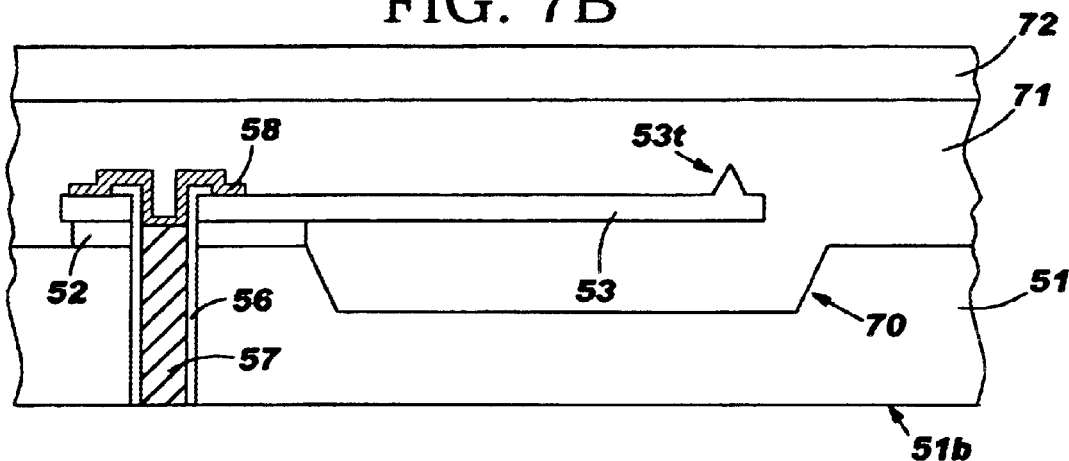
Figure 7C:
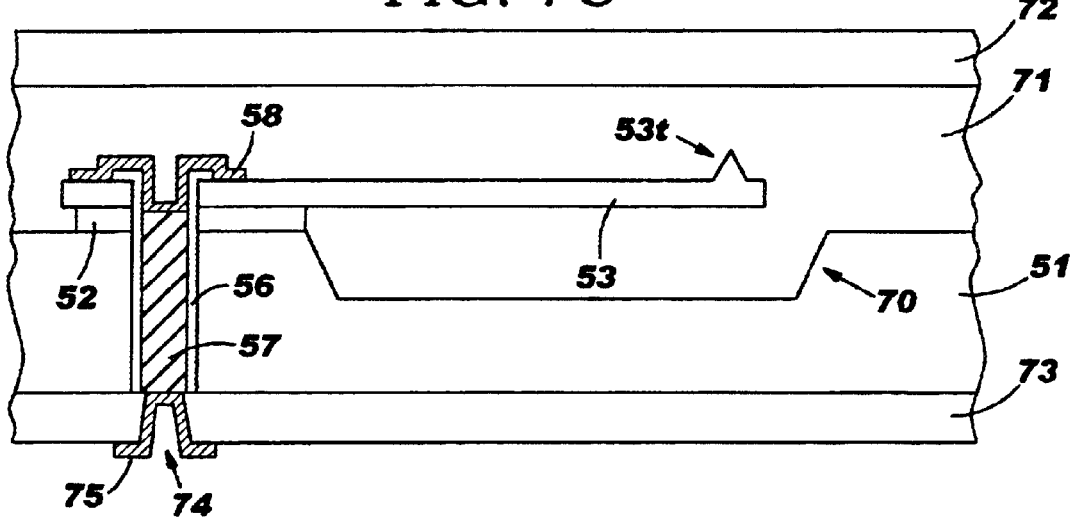

(2) FIG. 7A shows the structure of FIG. 5F, after the cavity etch is performed in the substrate 51 (using cavity opening 60 and layer 59 as a mask). The oxide layer 59 and BOX layer 52 are then etched; in particular, BOX layer 52 is etched at its underside through cavity 70, so that the remaining portion of silicon layer 53 becomes a cantilever overhanging cavity 70 (FIG. 7B). The top surface of the MEMS structure (including the cavity) is then covered with a polyimide layer 71, and a carrier plate 72 is bonded thereto. As noted above, the carrier plate is preferably transparent (e.g. a glass wafer). After the carrier is attached, the substrate is thinned so that metal 57 is exposed on the backside surface 51b of the substrate. This backside surface is then coated with a polyimide layer 73, which has openings 74 formed therein; metal pads 75 are formed in the openings to contact metal 57 (FIG. 7C). This MEMS structure is suitable for integration with a CMOS device using C4 connections, as follows.

MEMS/CMOS Integration Using C4

Figure 8A:
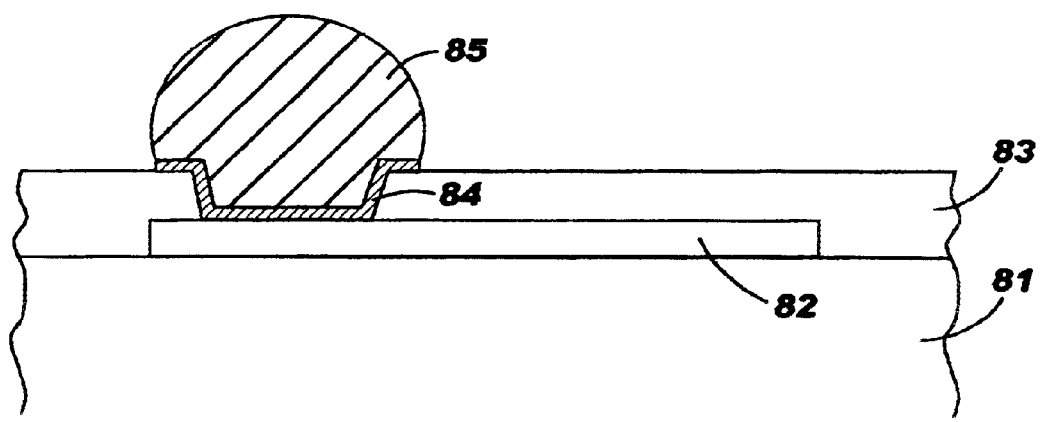
FIGS. 8A–8C illustrate steps in the 3-dimensional integration of a MEMS chip and a CMOS chip, using C4 connections.
Figure 8B:
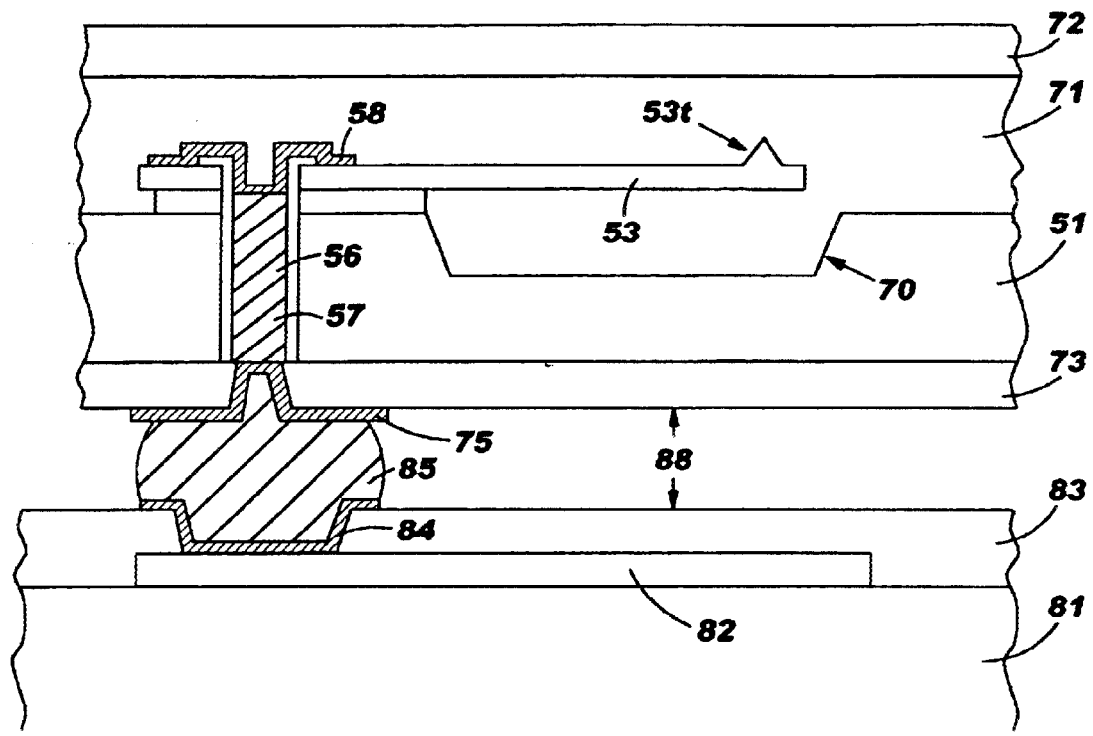
Figure 8C:
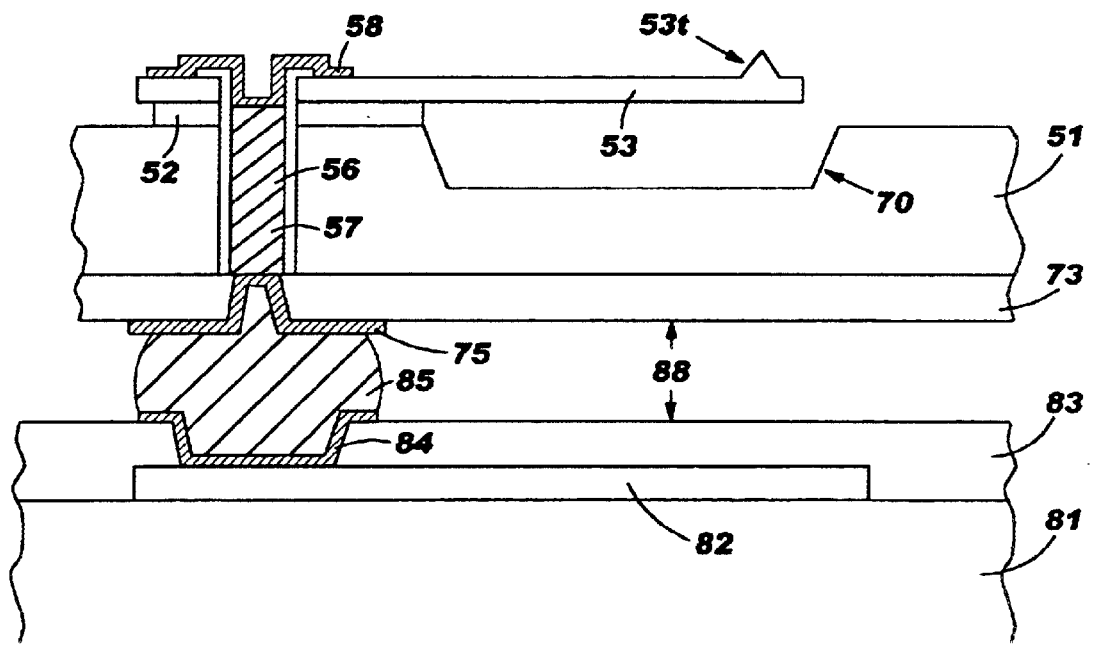

A process for MEMS/CMOS integration using C4 connections is shown in FIGS. 8A–8C. In FIG. 8A, CMOS substrate 81 is shown with a metal pad 82 on the surface thereof and a polyimide layer 83 overlying the substrate surface. (It is understood that the electronic devices for controlling the MEMS chip have already been fabricated and are part of the CMOS substrate 81; those CMOS devices will not be discussed in detail.) As understood by those skilled in the art, a C4 connection is prepared by forming an opening in the polyimide layer 83 to expose pad 82, depositing a seed layer 84 in the opening, and plating C4 metal through a mask. The mask and excess seed layer are then removed, and a reflow process is performed to yield the C4 bonding pad 85.

The MEMS chip (shown with the cavity 70 already formed, in accordance with FIG. 7C) is then aligned to the CMOS chip (using carrier 72) and bonded to the C4 pads. Specifically, pad 75 on the backside of the MEMS chip is bonded to the C4 pad 85, so that an electrical and thermal through-connection is made from the CMOS chip through the MEMS chip and to the cantilever structure (see FIG. 8B). Details of the C4 bonding process are known in the art.

The carrier 72 is then detached from polyimide layer 71 (preferably by laser ablation of the interface between the carrier and polyimide layer 71) and removed from the front side of the MEMS chip. Polyimide layer 71 is then removed, yielding the structure shown in FIG. 8C. It should be noted that in this embodiment, there is a gap 88 between opposite polyimide layers 73 and 83 on the MEMS and CMOS chips respectively.

MEMS/CMOS Integration Using Stud/Via Connections

Figure 9A:
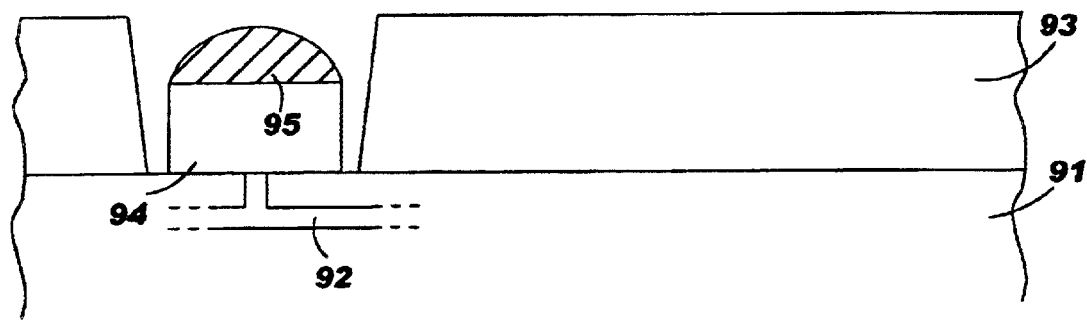
FIGS. 9A–9D illustrate steps in the 3-dimensional integration of a MEMS chip and a CMOS chip, using stud/via connections.

FIG. 9A shows a CMOS substrate 91, with electronic devices assumed to be already fabricated therein. Wiring connections 92 to the top surface of substrate 91 are shown in FIG. 9A. The substrate is covered by a polyimide layer 93, with openings formed therein to make connection to the CMOS devices. As shown in FIG. 9A, the openings are preferably tapered to facilitate alignment to the MEMS chip. Studs 94 are built in the openings, making electrical contact with wiring 92. The studs are capped with solder 95 for making connection to the metal pads on the MEMS chip.

Figure 9B:
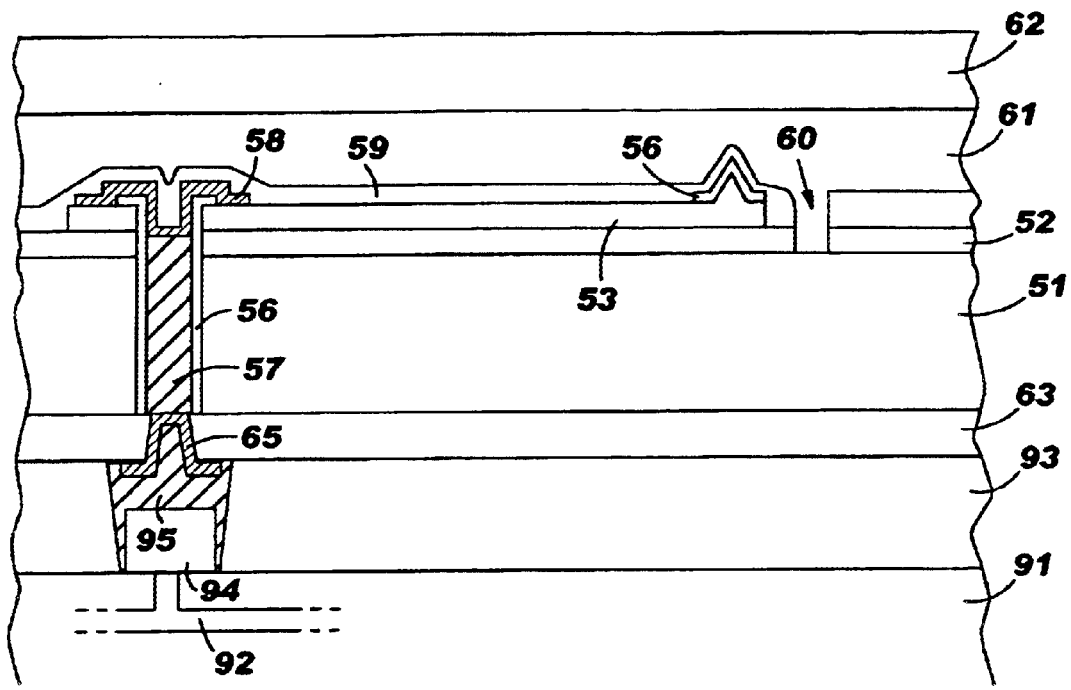

FIG. 9B shows the MEMS chip (processed in accordance with FIG. 6C) aligned and bonded to the CMOS chip. With presently available techniques, this alignment may be performed accurately to less than 1 μm. Polyimide layer 63 on the backside of the MEMS chip is brought into contact with polyimide layer 93 on the CMOS chip. Bonding pad 65 on the MEMS chip, which is in contact with the metallized via 57, is aligned to the stud 94. A high-temperature lamination process is then performed in which solder 95 is caused to flow, filling the opening in the polyimide layer and bonding to pad 65. It should be noted that in this embodiment, the opposing polyimide layers 63, 93 are in contact with no gap between the chips. One or both of polyimide layers 63, 93 may be coated with an adhesive before the lamination process is performed.

Figure 9C:
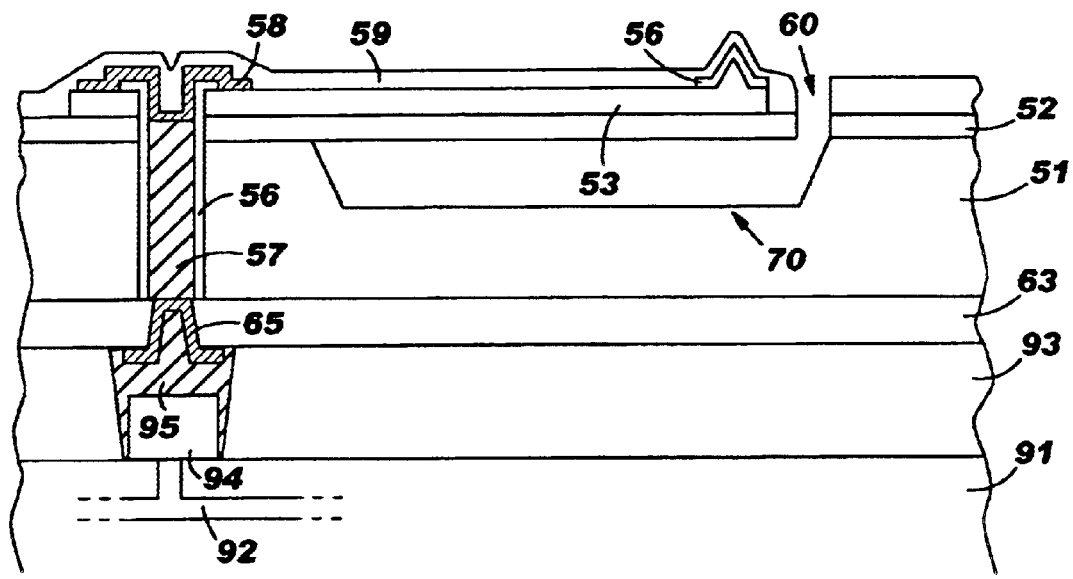

After the bonding process, the carrier 62 is removed from polyimide layer 61, preferably by laser ablation. Polyimide layer 61 is then removed to expose the cavity etch opening 60. The cavity etch processes are then performed to remove silicon from behind the cantilever structure (FIG. 9C); oxide layers 52, 56, 59 are then etched to expose the cantilever and cantilever tip. The completed MEMS/CMOS integrated structure is shown in FIG. 9D.

Figure 9D:
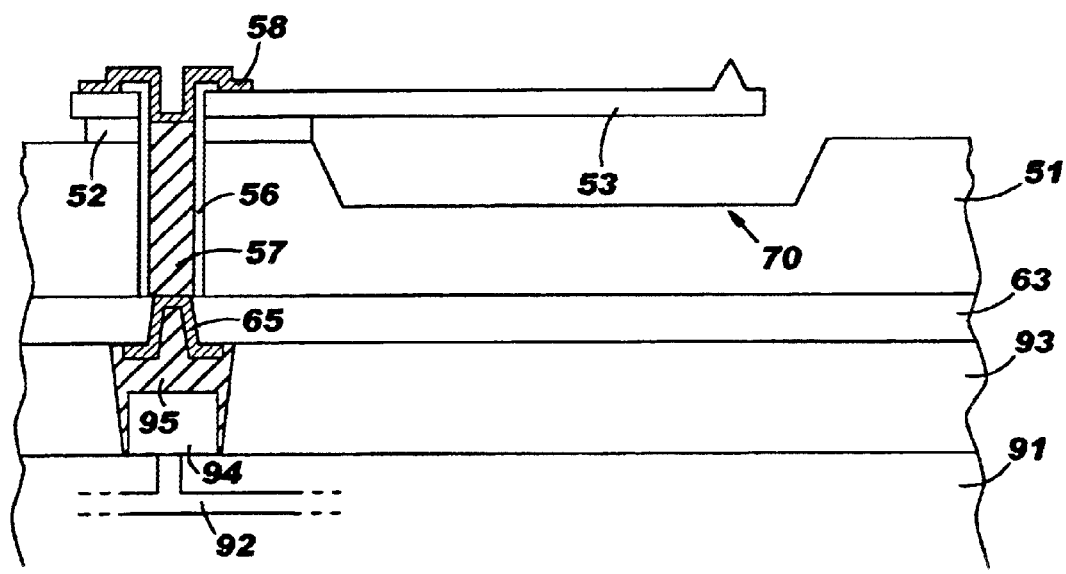
Figure 9E:
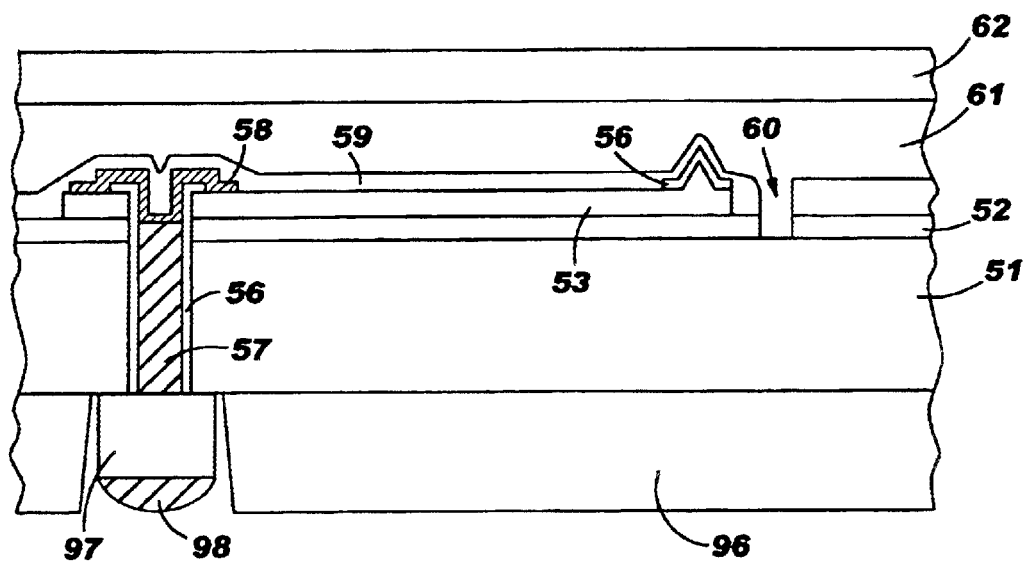
FIGS. 9E–9G illustrate steps in the 3-dimensional integration of a MEMS chip and a CMOS chip, using an alternative stud/via connection process.
Figure 9F:
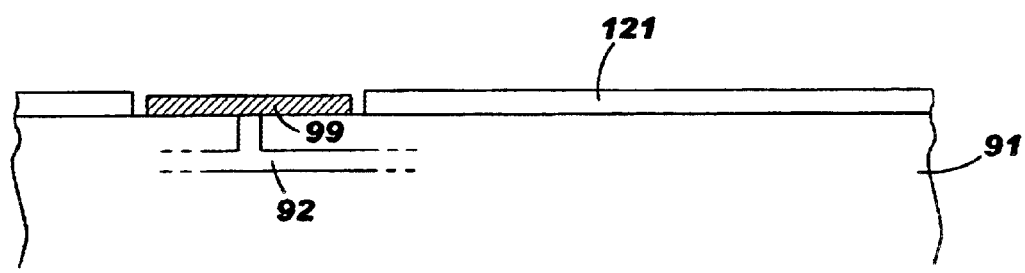
Figure 9G:
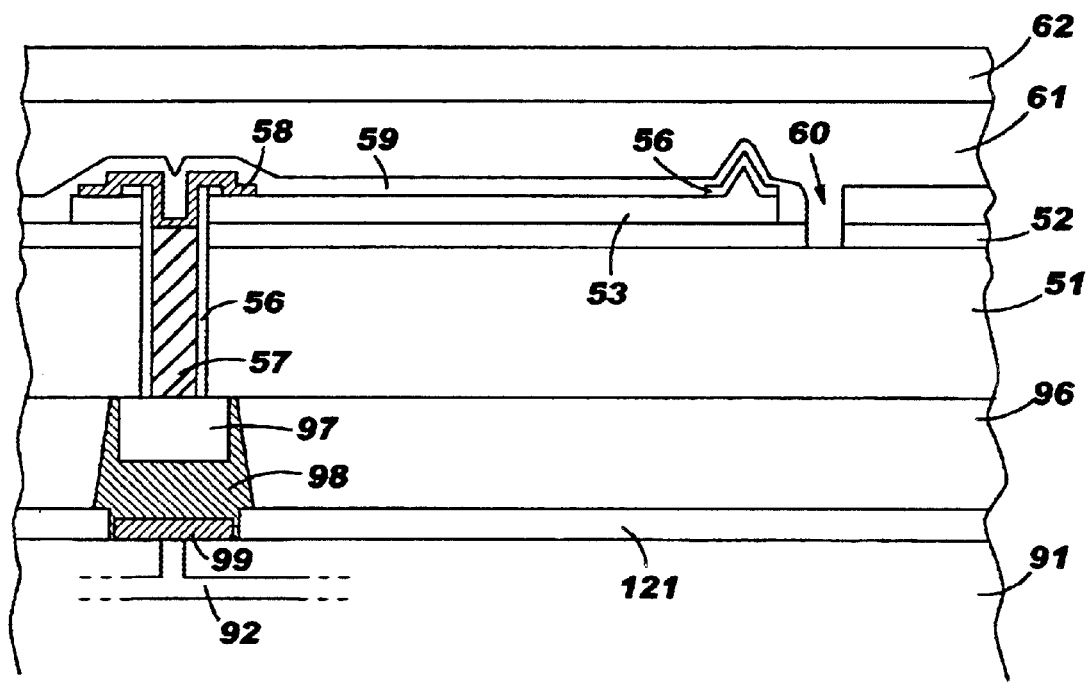

An alternative stud/via connection process is shown in FIGS. 9E–9G. In this process the studs are located on the MEMS chip instead of CMOS chip. As shown in FIG. 9E, the backside of the MEMS substrate (shown here processed as in FIG. 6B) is covered by a polyimide layer 96 and has openings formed therein. Studs 97 are then built in the openings and capped with solder 98 for making connection to the CMOS chip. The CMOS chip 91 has a polyimide layer 121 formed thereon, with openings for making electrical connections to the CMOS devices. Bonding pads 99 are formed in these openings, making electrical contact with wiring 92 (FIG. 9F; compare FIG. 9A). The MEMS chip and CMOS chip are then brought into contact with pad 99 aligned to stud 97, as shown in FIG. 9G (compare FIG. 9B). A high-temperature lamination process is performed as described above, so that solder 98 bonds to pad 99. One or both of polyimide layers 96, 121 may be coated with an adhesive before the lamination process is performed. After the bonding process, processing of the MEMS/CMOS integrated structure is completed as described above.

As shown in FIGS. 8C, 9D and 9G, the above-described processes yield a 3-dimensional integrated MEMS/CMOS structure in which electrical signals travel in the z-direction through the MEMS chip (that is, in the same direction in which the cantilever tip is actuated).

In another embodiment of the invention, electrical and thermal contact is made from the CMOS chip directly to the cantilever, without a through-wafer connection.

Cantilever/CMOS Direct Contact

Figure 10A:
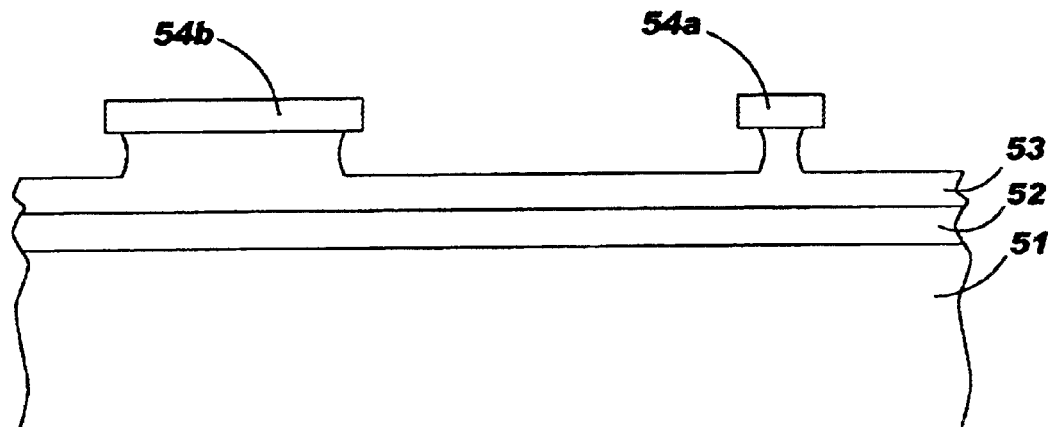
FIGS. 10A–10G illustrate steps in the 3-dimensional integration of MEMS devices with a CMOS chip, in accordance with another embodiment of the invention.

In this embodiment of the invention, the cantilever structure is anchored to a stud/via arrangement directly connected to the CMOS chip. Fabrication of the cantilever begins with an SOI wafer as previously discussed with reference to FIG. 5A. The oxide layer 54 is masked and etched so that portions 54a and 54b remain, as shown in FIG. 10A; the underlying silicon layer 53 is then etched. The unetched silicon areas are then processed to form the cantilever tip and anchor ends.

Figure 10B:
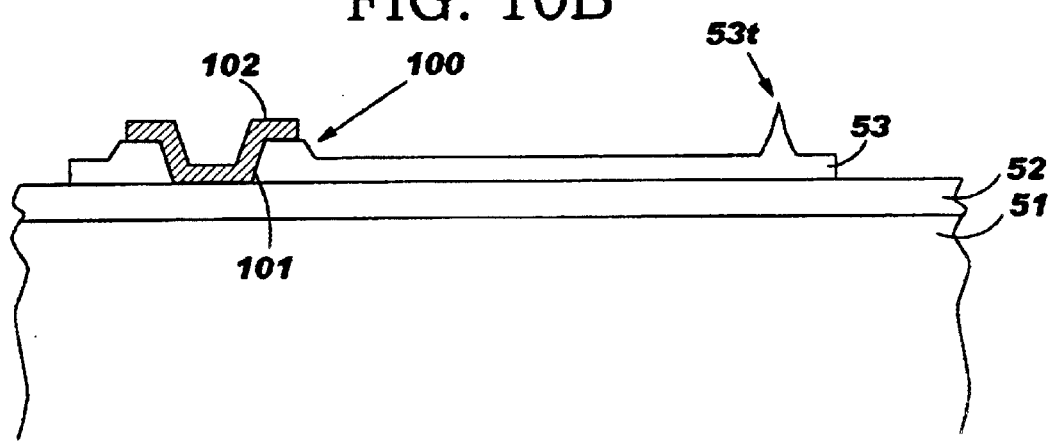
Figure 10C:
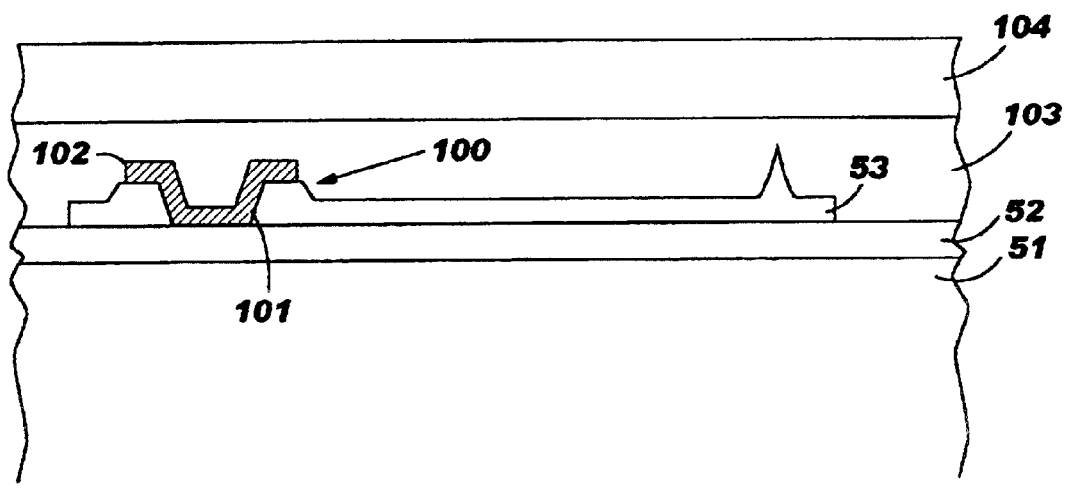

The cantilever tip 53t is sharpened by thermal oxidation of the silicon layer 53; the silicon layer is then patterned to form the cantilever, as shown in FIG. 10B. In particular, the anchor portion 100 of the cantilever has a via opening 101 formed therein, so that a portion of the underlying BOX layer 52 is exposed. A metal layer 102 is then formed in the via opening. This structure is then coated with a polyimide layer 103, and a carrier plate 104 is attached thereto (see FIG. 10C).

Figure 10D:
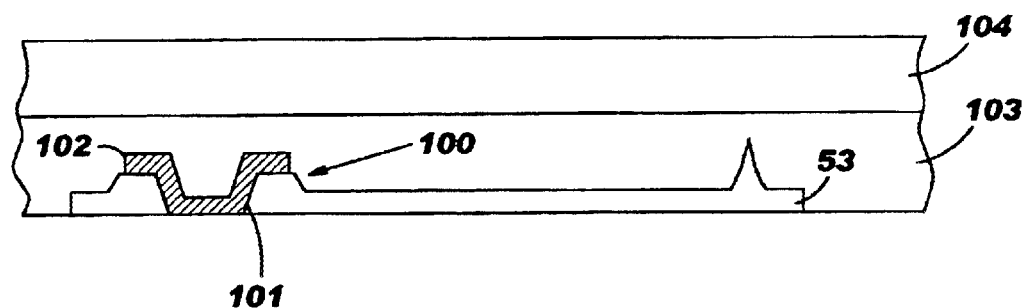

The silicon substrate 51 is then removed by a grinding, polishing, wet etch or plasma etch process. The BOX layer 52 is also removed, by either a wet etch or plasma etch process. The resulting structure is shown in FIG. 10D.

Figure 10E:
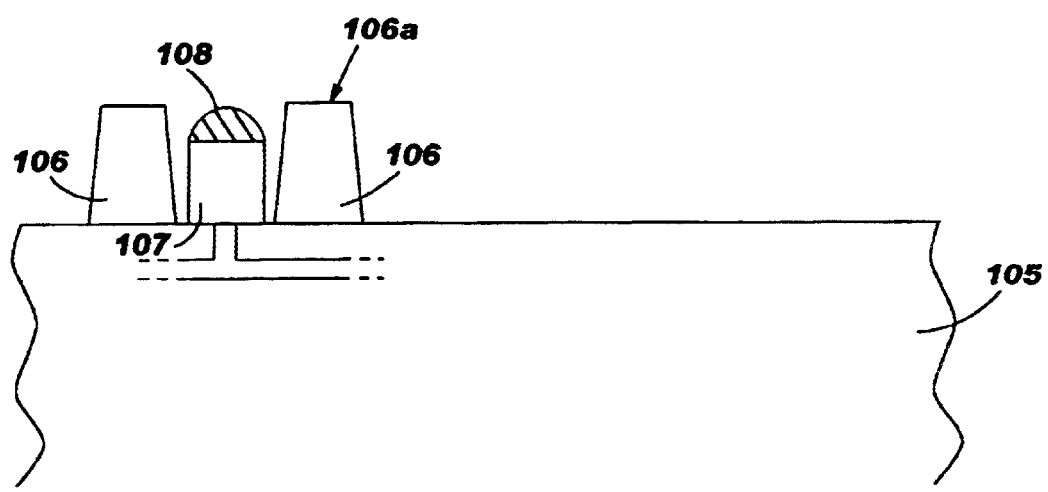

The CMOS chip is prepared as shown in FIG. 10E. As noted above, it is assumed that the CMOS substrate 105 has electronic devices formed therein with wiring connections at the surface of the substrate. An inorganic layer 106, 1 μm to 2 μm thick, is deposited on the substrate surface and patterned to form a structure having an opening exposing the wiring connection. A stud 107 is formed in the opening with solder 108 on top of the stud (as discussed above with reference to FIG. 9A).

Figure 10F:
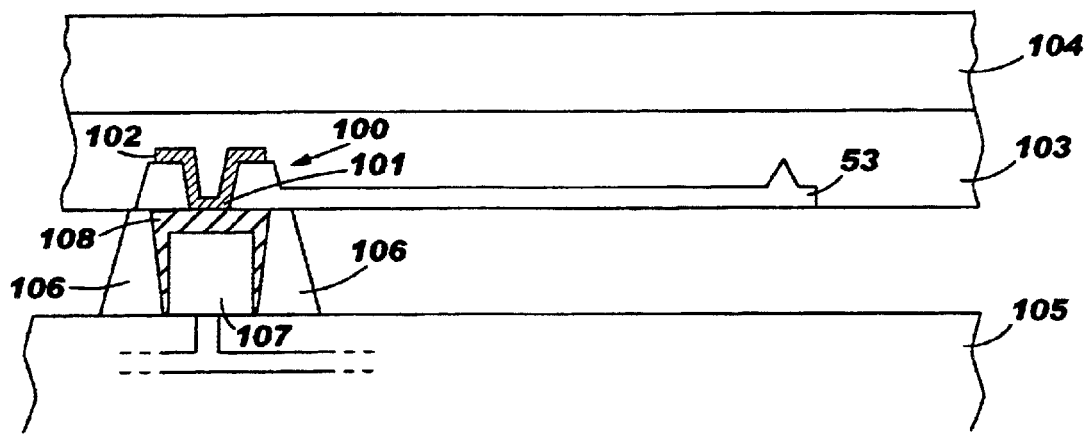
Figure 10G:
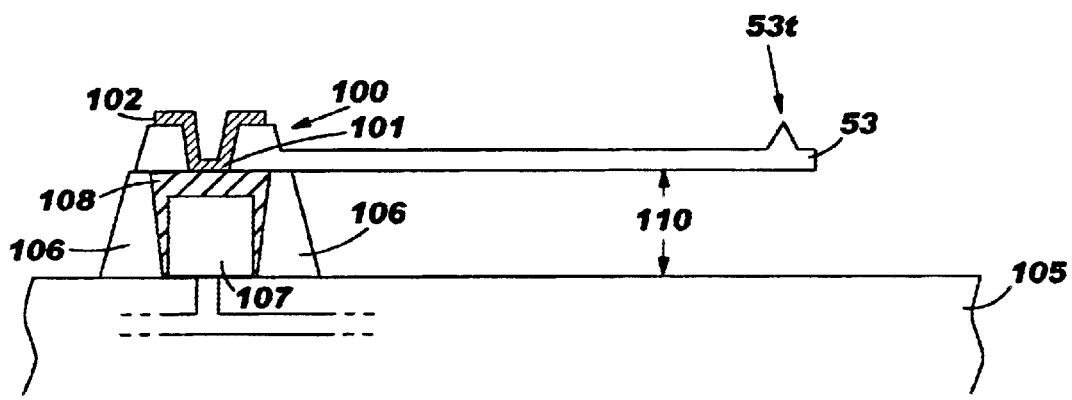

The MEMS chip and CMOS chip are then brought into alignment, with the anchor portion 100 of the cantilever contacting the top surface 106a of the patterned inorganic layer 106. A high-temperature lamination process is then performed in which the solder 108 is caused to flow, thereby establishing electrical and thermal contact between stud 107 and the metal pad 102 in the anchor portion 100 of the cantilever. The resulting structure is shown in FIG. 10F. The carrier plate 104 is then detached from the polyimide layer 103 (preferably by laser ablation, as discussed previously) and removed. Finally, the polyimide layer 103 is stripped away, preferably with a plasma process. As shown in FIG. 10G, the result of this process is an integrated structure where an array of separate MEMS devices are connected in the z-direction to a CMOS chip, without the need for through-connections in a MEMS substrate. Whereas in the previous embodiments it was necessary to etch a cavity 70 in the substrate to provide a range of vertical motion for the tip, in this embodiment a spacing 110 is established between the chip and the cantilever in accordance with the thickness of layer 106.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for fabricating an integrated structure including a micro-electromechanical system (MEMS) and a chip for delivering signals to the MEMS, the method comprising the steps of:

providing a MEMS substrate having a surface;

forming the MEMS to provide an anchor portion therein, the MEMS being connected to the MEMS substrate at the anchor portion;

forming a conductor from the anchor portion of the MEMS through the MEMS substrate; including,
   forming a via in the substrate,
   depositing metal in the via,
   attaching a carrier plate to the MEMS substrate, where the carrier plate is transparent to ablating radiation,
   thinning the MEMS substrate at a backside thereof to expose the metal, and
   forming a metal pad at the backside surface in contact with the metal in the via; and attaching the chip to the MEMS substrate in a direction normal to said surface, so as to make a conductive path from the chip to the MEMS,
   wherein said step of attaching the chip includes exposing the carrier plate to ablating radiation, thereby detaching the carrier plate.

2. A method according to claim 1, wherein said step of attaching the chip is performed using controlled collapsed chip connection (C4) technology and further comprises:

forming a C4 metal pad on the chip;
   aligning the C4 metal pad to the conductor; and
   bonding the C4 metal to the conductor.

3. A method according to claim 1, wherein said step of attaching the chip further comprises:

forming one of a metal stud and a metal pad on the chip;
   forming the other of the metal stud and the metal pad in contact with the conductor;
   aligning the stud to the pad; and
   bonding the stud to the pad.

4. A method according to claim 3, wherein
   said step of forming the conductor includes coating a backside surface of the MEMS substrate with a first polyimide layer, forming an opening in the first polyimide layer to expose the conductor, and forming one of the metal stud and the metal pad in contact with the conductor, and said step of attaching the chip includes coating the chip with a second polyimide layer, forming an opening in the second polyimide layer in which the other of the metal stud and the metal pad is formed, and performing a lamination process to bond the first polyimide layer and the second polyimide layer.

5. A method according to claim 4, wherein subsequent to said lamination process formation of the MEMS is completed, including forming a cavity in the MEMS substrate so that the MEMS has a cantilever structure.

6. A method according to claim 1, wherein the MEMS is formed so as to have a tip extending in the direction normal to said surface.

7. A method according to claim 6, further comprising the step of providing a storage medium layer in contact with the tip, wherein said layer comprises a storage medium for storing data in accordance with indentations made therein by the tip.

8. A method according to claim 1, wherein said step of forming the MEMS further comprises:

forming a cantilever structure having one end at the anchor portion and another end having a tip extending in the direction normal to the surface; and forming a cavity in the substrate in a portion thereof underlying the cantilever.

9. A method for fabricating an integrated structure including a micro-electromechanical system (MEMS) and a chip for delivering signals to the MEMS, the method comprising the steps of:

providing a MEMS substrate having a surface;

forming the MEMS on the substrate, the MEMS having an anchor portion with an opening therein;

forming a conductor in the opening of the anchor portion of the MEMS;

depositing a first layer overlying the MEMS;

subsequently removing the MEMS substrate, thereby exposing an underside of the MEMS and the conductor; and attaching the chip to the anchor portion of the MEMS in a direction normal to said surface, so as to make a conductive path from the chip to the MEMS.

10. A method according to claim 9, further comprising the steps of:

depositing a second layer on the chip;

forming an opening in the second layer; and forming a metal stud in the opening in the second layer, and wherein said attaching step further comprises aligning the metal stud to the conductor at the underside of the MEMS; and performing a lamination process to bond the MEMS to the second layer.

11. A method according to claim 10, wherein said step of forming the MEMS further comprises forming a cantilever structure having one end at the anchor portion and another end having a tip extending in the direction normal to the surface, and therein the cantilever is spaced from the chip by a distance corresponding to a thickness of the second layer.

12. A method according to claim 9, further comprising the steps of:

depositing a second layer on the chip;

forming an opening in the second layer;

forming a metal pad in the opening in the second layer; and forming a metal stud on the underside of the MEMS in contact with the conductor, and wherein said attaching step further comprises aligning the stud to the pad; and performing a lamination process to bond the MEMS to the second layer.

13. A method according to claim 12, wherein said step of forming the MEMS further comprises forming a cantilever structure having one end at the anchor portion and another end having a tip extending in the direction normal to the surface, and wherein the cantilever is spaced from the chip by a distance corresponding to a thickness of the second layer.

14. A method according to claim 9, wherein the carrier plate is transparent to ablating radiation, and further comprising the steps of:

exposing the carrier plate to ablating radiation, thereby detaching the carrier plate from the first layer; and removing the first layer, after said step of attaching the chip.

15. A vertically integrated structure connecting a micro-electromechanical system (MEMS) and a chip for delivering signals to the MEMS, the structure comprising:

a layer overlying and in contact with a portion of the chip and having an opening therein;

the MEMS having an anchor portion and an end portion extending horizontally therefrom, the anchor portion being attached to the layer and including a conductor aligned to the opening; and a metal stud in the opening, the stud contacting the chip and the conductor, wherein the anchor portion of the MEMS is spaced from the chip by a distance corresponding to a thickness of the layer.

16. A vertically integrated structure according to claim 15, wherein the MEMS comprises a cantilever structure and the end portion includes a tip extending in the vertical direction.

17. A vertically integrated structure according to claim 16, further comprising a layer extending horizontally and spaced from the chip in the vertical direction, said layer being in contact with the tip.

18. A method for fabricating an integrated structure including a micro-electromechanical system (MEMS) and a chip for delivering signals to the MEMS, the method comprising the steps of:

providing a MEMS substrate having a surface;

forming the MEMS to provide an anchor portion therein, the MEMS being connected to the MEMS substrate at the anchor portion;

forming a conductor from the anchor portion of the MEMS through the MEMS substrate;

attaching a carrier plate to the MEMS;

attaching the chip to the MEMS substrate in a direction normal to said surface, so as to make a conductive path from the chip to the MEMS; and subsequently detaching the carrier plate.

19. A method according to claim 18, wherein the carrier plate is transparent to ablating radiation, and said detaching the carrier plate is performed by exposing the carrier plate to ablating radiation.

20. A method according to claim 18, wherein said step of attaching the chip to the MEMS substrate is performed using stud/via connections.

21. A method for fabricating an integrated structure including a micro-electromechanical system (MEMS) and a chip for delivering signals to the MEMS, the method comprising the steps of:

providing a MEMS substrate having a surface;

forming the MEMS on the substrate, the MEMS having an anchor portion with an opening therein;

forming a conductor in the opening of the anchor portion of the MEMS;

attaching a cattier plate to the MEMS;

removing the MEMS substrate, thereby exposing an underside of the MEMS and the conductor;

attaching the chip to the anchor portion of the MEMS in a direction normal to said surface, so as to make a conductive path from the chip to the MEMS; and subsequently detaching the carrier plate.

22. A method according claim 21, wherein the carrier plate is transparent to ablating radiation, and said detaching the carder plate is performed by exposing the carrier plate to ablating radiation.

23. A method according to claim 21, wherein said step of attaching the chip to the anchor portion of the MEMS is performed using stud/via connections.

* * * * *